(12) United States Patent
Kim et al.

(10) Patent No.: US 10,171,078 B2
(45) Date of Patent: Jan. 1, 2019

(54) NONVOLATILE MEMORY DEVICES WITH ON DIE TERMINATION CIRCUITS AND CONTROL METHODS THEREOF

(71) Applicant: Samsung Electronics Co., Ltd., Suwon-si, Gyeonggi-do (KR)

(72) Inventors: Chul Bum Kim, Seoul (KR); Sangchul Kang, Hwaseong-si (KR); Jinho Ryu, Seoul (KR); Seokcheon Kwon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/882,714

(22) Filed: Oct. 14, 2015

(65) Prior Publication Data

US 2016/0036438 A1 Feb. 4, 2016

Related U.S. Application Data

(63) Continuation of application No. 13/286,713, filed on Nov. 1, 2011, now Pat. No. 9,183,901.

(60) Provisional application No. 61/410,115, filed on Nov. 4, 2010.

(30) Foreign Application Priority Data

Nov. 4, 2010 (KR) .................. 10-2010-0109409

(51) Int. Cl.
*G11C 5/06* (2006.01)
*G11C 7/10* (2006.01)
*H03K 19/00* (2006.01)

(52) U.S. Cl.
CPC ......... *H03K 19/0005* (2013.01); *G11C 5/063* (2013.01); *G11C 7/1057* (2013.01); *G11C 7/1084* (2013.01)

(58) Field of Classification Search
None
See application file for complete search history.

(56) References Cited

U.S. PATENT DOCUMENTS

| | | | |
|---|---|---|---|
| 5,986,959 | A | 11/1999 | Itou |
| 7,525,337 | B2 | 4/2009 | Park et al. |
| 8,238,175 | B2 | 8/2012 | Fujisawa |
| 2003/0031076 | A1 | 2/2003 | Widmer et al. |
| 2004/0228196 | A1 | 11/2004 | Kwak et al. |
| 2006/0031593 | A1* | 2/2006 | Sinclair .................. G06F 13/42 709/251 |
| 2006/0245272 | A1 | 11/2006 | Hartono et al. |
| 2008/0112233 | A1 | 5/2008 | Woo et al. |

(Continued)

FOREIGN PATENT DOCUMENTS

| | | |
|---|---|---|
| CN | 1 992 072 A | 7/2007 |
| JP | 10228769 A | 8/1998 |
| KR | 100266117 B1 | 10/2000 |

(Continued)

*Primary Examiner* — J. H. Hur
(74) *Attorney, Agent, or Firm* — Harness, Dickey & Pierce, P.L.C.

(57) ABSTRACT

Non-volatile memory devices including on-die termination circuits connected to an input/output circuit and an on-die termination control logic detecting a preamble of a strobe signal based on a command and a control signal and activating the on-die termination within the preamble period.

13 Claims, 17 Drawing Sheets

(56) References Cited

U.S. PATENT DOCUMENTS

2009/0034344 A1     2/2009  Nguyen et al.
2009/0213659 A1*    8/2009  Lee ...................... G11C 7/1051
                                                            365/185.18

FOREIGN PATENT DOCUMENTS

KR      20010027123 A      4/2001
KR      20080107559 A     12/2008
KR      20100094376 A      8/2010

* cited by examiner

NONVOLATILE MEMORY DEVICES WITH ON DIE TERMINATION CIRCUITS AND CONTROL METHODS THEREOF

CROSS-REFERENCE TO RELATED APPLICATIONS

This application is a continuation application of U.S. patent application Ser. No. 13/286,713, filed on Nov. 1, 2011, and claims priority under 35 U.S.C § 119 to Korean Patent Application No. 10-2010-0109409, filed Nov. 4, 2010, in the Korean Intellectual Property Office (KIPO) and U.S. provisional Patent Application Ser. No. 61/410,115 filed Nov. 4, 2010, the entire contents of each of which are incorporated herein by reference.

BACKGROUND

1. Field

Example embodiments relate to non-volatile memory devices including on-die termination circuits and control methods thereof.

2. Description of the Related Art

Semiconductor memory devices may be classified mainly into volatile memory devices and non-volatile memory devices. Write speed of volatile memory devices is rapid, while contents stored therein disappear at power-off. On the other hand, non-volatile memory devices retain contents stored therein even at power-off. For this reason, non-volatile memory devices are utilized to store contents to be retained regardless of whether power is supplied. In particular, as a type of non-volatile memory device, flash memory is applied to large-volume auxiliary memory devices because higher integration density may be achieved with flash memory than conventional electrically erasable programmable read-only memory (EEPROM).

Mobile circumstances may need high integration density, low-power and high-reliability non-volatile memory devices. Upon designing of high-speed non-volatile memory devices, AC characteristics associated with the input and output of data/address/control may be addressed. AC characteristics are not based on characteristics of integrated circuit devices or controllers for controlling integrated circuit devices, but based on characteristics of channels connecting two or more devices. Therefore, channel characteristics may be considered during high-speed integrated circuit device design.

Example of channel characteristic improvement includes the use of on-die termination (ODT) circuits or off-chip driver circuits. The impedance of signal lines can be adjusted via the ODT circuit. For example, by the ODT circuit, the channel impedance may be adjusted to have a value of about 50Ω. However, where an ODT circuit is used, the data integrity increases, while power consumption increases.

SUMMARY

Example embodiments of the inventive concepts may provide non-volatile memory devices including on-die termination circuits connected to input/output circuits; and an on-die termination control logic detecting a preamble of a strobe signal based on a command and a control signal and activating the on-die termination within the preamble period.

Example embodiments of the inventive concepts may provide on-die termination methods including detecting a preamble period or a postamble period of input/output data based on an external command or an externally provided control signal received in synchronization with a write enable signal.

A nonvolatile memory device according to at least one embodiment includes an input/output stage and an on-die termination control logic configured to change impedance of the input/output stage a plurality of times during a data transfer operation.

A non-volatile memory device according to at least one example embodiment of the inventive concepts provides high-speed and low-power characteristics by activating ODT within a period where data reliability is required.

BRIEF DESCRIPTION OF THE DRAWINGS

Example embodiments will be more clearly understood from the following brief description taken in conjunction with the accompanying drawings.

FIG. 1 is a block diagram illustrating storage devices according to example embodiments of the inventive concepts;

FIG. 2 is a timing diagram illustrating on-die termination operations in a non-volatile memory device of FIG. 1;

FIG. 3 is a block diagram illustrating non-volatile memory devices according to example embodiments of the inventive concepts;

FIG. 4 is a circuit diagram illustrating first ODT control logic of FIG. 3 according to example embodiments of the inventive concepts;

FIG. 5 is a timing diagram illustrating operation of a decoder and a first ODT control circuit of FIG. 3;

FIG. 6 is a block diagram illustrating non-volatile memory devices according to other example embodiments of the inventive concepts;

FIG. 7 is a circuit diagram illustrating an ODT circuit of FIG. 6 according to example embodiments of the inventive concepts;

FIG. 8 is a block diagram illustrating ODT control logic of FIG. 6 according to example embodiments of the inventive concepts;

FIG. 9 is a state diagram illustrating operation of command detect logic of FIG. 8 according to example embodiments of the inventive concepts;

FIG. 10 is a state diagram illustrating operation of pin detect logic of FIG. 8 according to example embodiments of the inventive concepts;

FIG. 11 is a state diagram illustrating operation of ODT disable logic of FIG. 8 according to example embodiments of the inventive concepts;

FIG. 12 is a timing diagram illustrating read operations of non-volatile memory devices according to still other example embodiments of the inventive concepts;

FIG. 13 is a timing diagram illustrating write operations of non-volatile memory devices according to still other example embodiments of the inventive concepts;

FIG. 14 is a flowchart illustrating control methods for an ODT circuit in the ODT control logic of FIG. 6;

FIG. 15 is a block diagram illustrating solid state disk (SSD) systems according to example embodiments of the inventive concepts;

FIG. 16 is a block diagram illustrating memory systems according to example embodiments of the inventive concepts; and FIG. 17 is a block diagram illustrating computing systems according to example embodiments of the inventive concepts.

Figure 1:
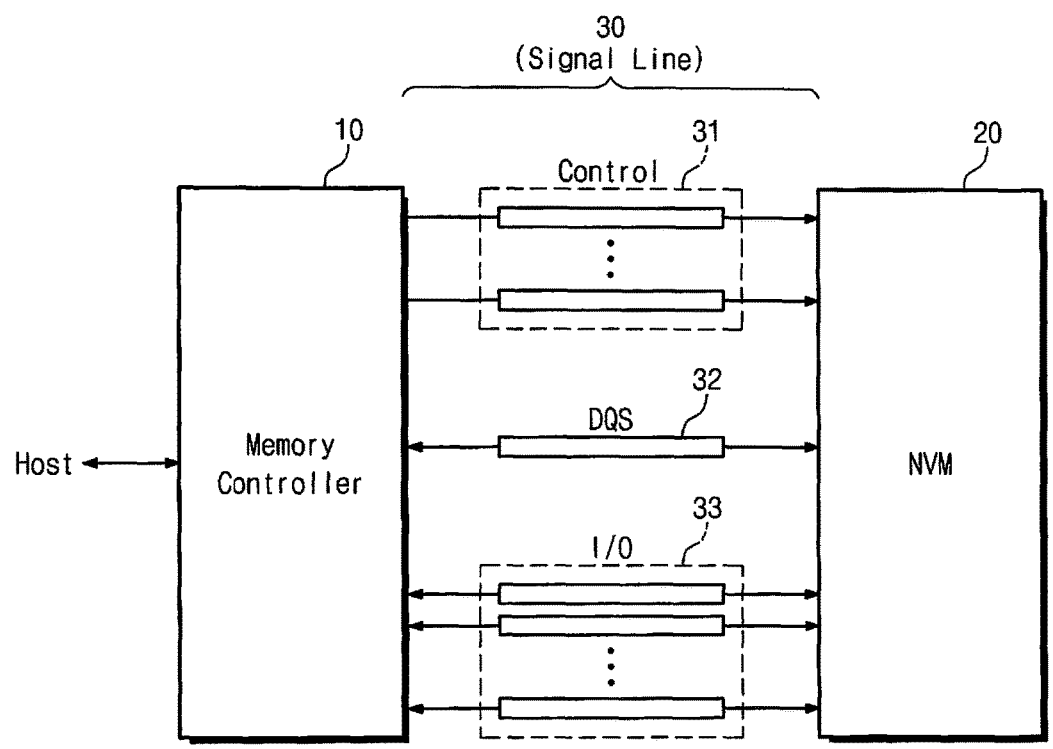
FIGS. 1-17 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Herein, a flash memory device is used as an example in order to describe characteristics and functions of example embodiments of the inventive concepts. However, example embodiments are not so limited. For example, example embodiments may be applied to PRAM, MRAM, ReRAM, FRAM, NOR flash memory, and/or the like.

FIG. 1 is a block diagram illustrating storage devices according to example embodiments of the inventive concepts. Referring to FIG. 1, a storage device may include a memory controller 10, a non-volatile memory device 20, and a channel 30 formed of signal lines. The memory controller 10 may respond to a read/write request of a host and may control the non-volatile memory device 20 to program and read data. The memory controller 10 may use an algorithm, for example, a flash translation layer (FTL) between a file system and the non-volatile memory device 20 in order to hide delete operations of the non-volatile memory device 20. The memory controller 10 may detect and correct errors in data read from the non-volatile memory device 20. The memory controller 10 may use a strobe signal DQS upon exchanging data with the non-volatile memory device 20.

The non-volatile memory device 20 may include non-volatile memory elements capable of retaining stored data even at power-off. The non-volatile memory device 20 may receive control signals (e.g., /RE, /WE, /CE, ALE, CLE and/or the like) from the memory controller 10. Control signals may be transferred via control signal lines 31.

The non-volatile memory device 20 may exchange a strobe signal (hereinafter, referred to as a DQS signal) and input/output data with the memory controller 10. The DQS signal may be exchanged via a DQS signal line 32 between the non-volatile memory device 20 and the memory controller 10, and input/output data may be exchanged via data lines 33 between the non-volatile memory device 20 and the memory controller 10. The DQS signal may be used to provide a reference point of time for determining a logic value of input/output data. Upon high-speed data exchange, it may be possible to provide a point of time of exactly judging input/output data by the DQS signal.

The non-volatile memory device 20 according to example embodiments of the inventive concepts may include an on-die termination (ODT) circuit. The non-volatile memory device 20 may adjust the impedance of an input/output stage via the ODT circuit. The swing voltage level widths of input/output data and control signals may be reduced by adjusting the impedance (e.g., by increasing the resistance value). Because signal loading may become clear by impedance adjustment, an over-shoot/under-shoot phenomenon may decrease remarkably. If the ODT circuit is activated, waveforms of input/output data and control signals may be stabilized, and may, thus, improve data reliability.

The non-volatile memory device 20 according to at least one example embodiment of the inventive concepts may control a turn-on point of time of the ODT circuit via control signals and commands. The non-volatile memory device 20 may turn on the ODT circuit within a period where write data is received essentially. If data input is ended, the ODT circuit may be turned off. At a read operation, the ODT circuit may be turned on to receive a control signal essentially needed at a data output point of time. If data output is ended, the ODT circuit for the control signal activated at a data output point of time may be turned off. An ODT circuit in the non-volatile memory device 20 may be controlled through variation of commands or control signals.

Figure 2:
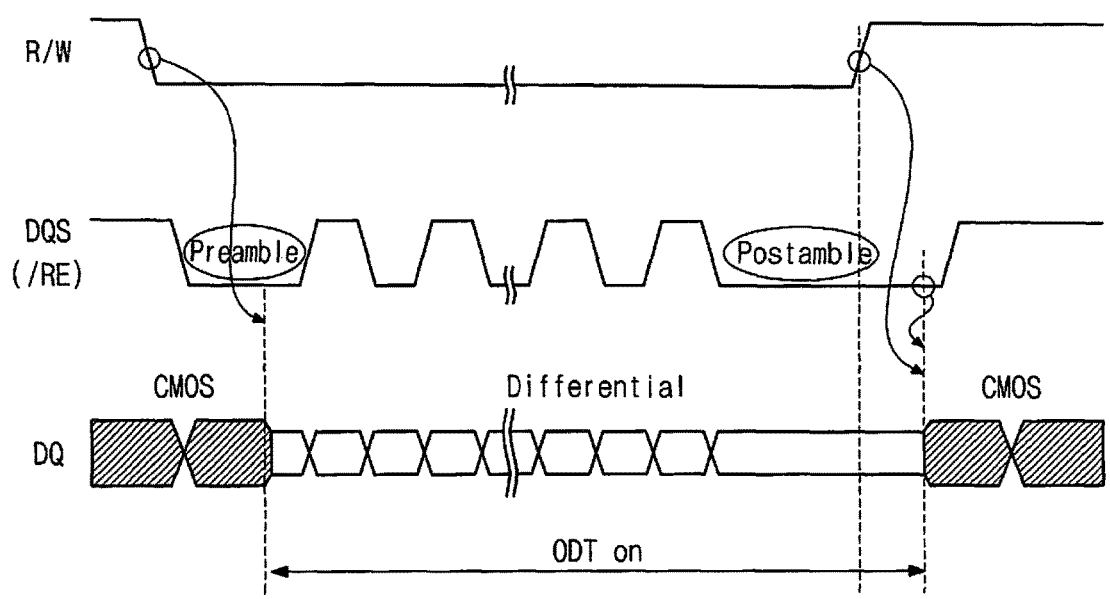

FIG. 2 is a timing diagram illustrating on-die termination operations in a non-volatile memory device of FIG. 1. Referring to FIG. 2, a non-volatile memory device 20 according to at least one example embodiment of the inventive concepts may detect a transition state of a control signal (e.g., /RE, /WE and/or DQS) to determine turn-on and turn-off points of time of an ODT circuit. If data input/output is activated (at 'L' of a signal R/W) and a preamble point of time of a strobe signal DQS and/or a read enable signal /RE is detected, the ODT circuit may be turned on. An active point of time of data input/output may be detected via a transition of an input/output control signal (e.g., /WE and/or /RE). A preamble period of the strobe signal DQS may be set to a period where a DQS level may transition into logic '0' firstly. A postamble period of the strobe signal DQS may be set to an end point of time of a read/write operation (an R/W rising edge).

Herein, it is well understood that a waveform of the strobe signal DQS may be changed variously according to characteristics of memory devices. The strobe signal DQS may correspond to a read enable signal /RE at a read operation. If the ODT circuit is turned on, levels of data signals DQ may be changed. Before the ODT circuit is turned on, a signal transferred by a single level signal (CMOS signal) may be changed into a differential signal. If the ODT circuit is turned on, an input buffer receiving a data signal DQ may be changed to a pseudo differential signal input buffer from a CMOS input buffer. If the ODT circuit is turned on, an input buffer receiving a strobe signal DQS may be changed to a differential signal input buffer from a CMOS input buffer. If the ODT circuit is turned on, an input buffer receiving a read enable signal /RE may be changed to a differential signal input buffer from a CMOS input buffer. If the ODT circuit is turned on, substantial signal levels may be lowered relatively. It is known that an eye opening indicating the noise margin increases according to a result obtained by measuring the eye pattern characteristic. If the ODT circuit is turned on, the reliability of transferred data or signals may increase.

Herein, start and end points of time of a read/write operation may be determined by decoding control signals and/or input commands.

Figure 3:
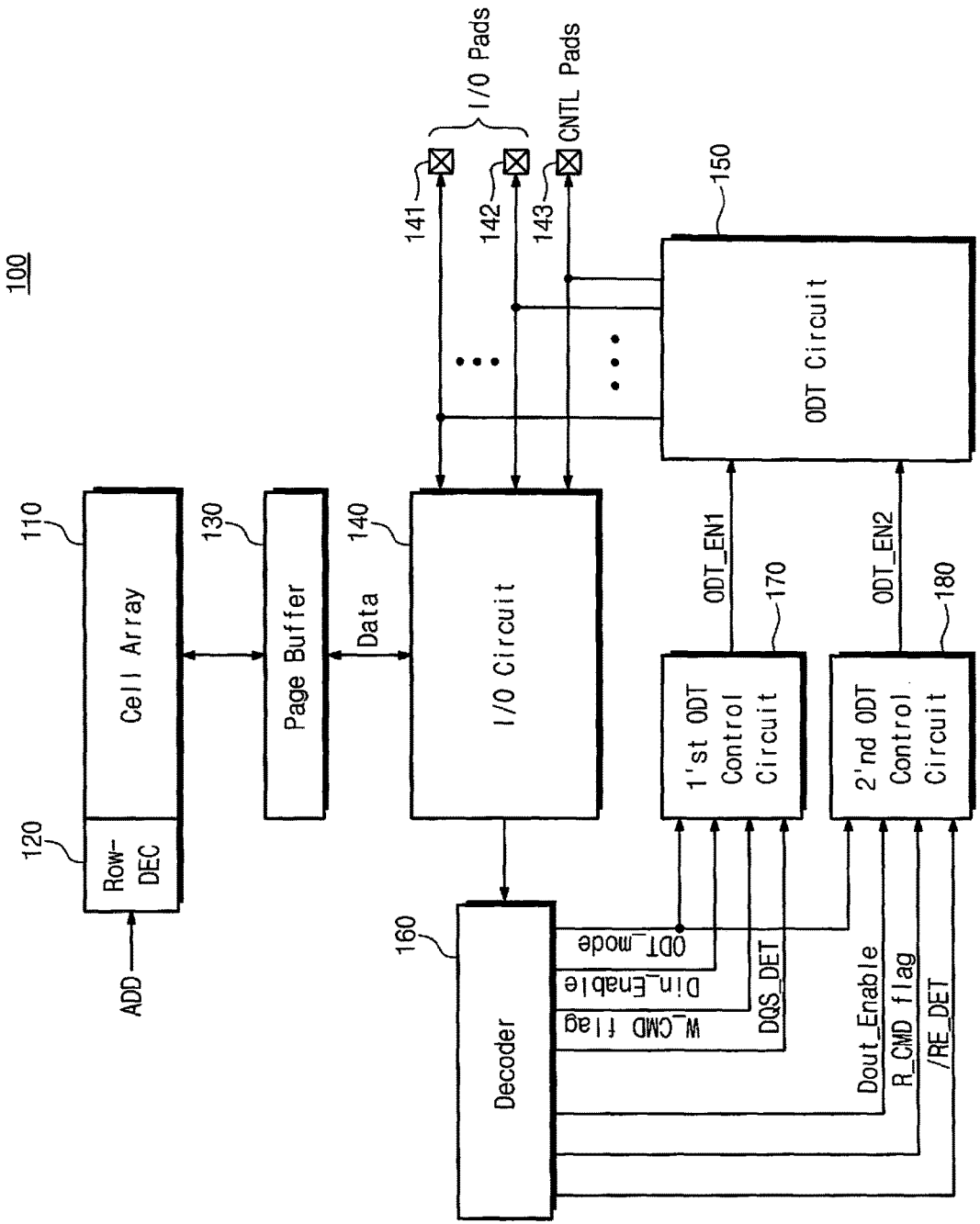

FIG. 3 is a block diagram illustrating non-volatile memory devices according to example embodiments of the inventive concepts. Referring to FIG. 3, a non-volatile memory device 100 may include an ODT circuit 150, a decoder 160 for controlling the ODT circuit 150, a first ODT control circuit 170, and a second ODT control circuit 180. Herein, the decoder 160, the first ODT control circuit 170, and the second ODT control circuit 180 may constitute ODT control logic.

A cell array 110 may include memory cells connected with bit lines and word lines. A row decoder 120 may select a word line in response to an address ADD. The row decoder 120 may supply selected word lines with various word line voltages that may be provided from a voltage generator (not shown). At a write operation, the row decoder 120 may supply a selected word line with a program voltage (e.g., about 15V to 20V) and a verify voltage, and unselected word lines with a pass voltage. At a read operation, the row decoder 120 may supply a selected word line with a read voltage (e.g., about 5V) and unselected word lines with a pass voltage.

A page buffer 130 may operate as a write driver and/or a sense amplifier according to a mode of operation. For example, the page buffer 130 may operate as a sense amplifier at a read mode of operation and a write driver at a write mode of operation. The page buffer 130 may supply a ground voltage (e.g., 0V) to bit lines of selected memory cells upon writing of write data in the cell array 110. The page buffer 130 may supply a pre-charge voltage (e.g., Vcc) to bit lines of program-inhibited memory cells. An input/output circuit 140 may temporarily store command and/or program data received via input/output pads. The input/output circuit 140 may transfer temporarily stored data into the page buffer 130. The input/output circuit 140 may transfer a received command and a level of a control signal into the decoder 160. The input/output circuit 140 may include a data input buffer and a data output buffer.

The ODT circuit 150 may adjust the impedance of signal lines corresponding to input/output pads 141 and 142, and/or control pads 143. If an ODT mode is activated, the ODT circuit 150 may adjust the impedance with an impedance value set for the ODT mode. The ODT circuit 150 may enter and/or terminate the ODT mode in response to the first ODT control circuit 170 and/or the second ODT control circuit 180. The ODT circuit 150 may be connected between the input/output circuit 140 and the pads 141-143 to adjust the impedance. If the ODT circuit 150 is activated, the impedance (or resistance) of each pad 141, 142 and 143 may be adjusted to a target value. The ODT circuit 150 may be formed to share a driver which may form a data output buffer among the input/output circuit 140.

The decoder 160 may decode commands via control signals (e.g., /CE, CLE, ALE, /WE, /RE, DQS and/or the like.) that may be provided from the input/output circuit 140. The decoder 160 may output an ODT mode signal ODT_mode provided by a set feature command. The ODT mode signal ODT_mode may be provided to the first and second ODT control circuits 170 and 180. The decoder 160 may decode a read/write command to generate a write command flag signal W_CMD flag and a read command flag signal R_CMD flag. The write command flag signal W_CMD flag may be provided to the first ODT control circuit 170 and the read command flag signal R_CMD flag may be provided to the second ODT control circuit 180. The write command flag signal W_CMD flag and the read command flag signal R_CMD flag may be valid until a next command is received.

The decoder 160 may generate an input enable signal Din_Enable and an output enable signal Dout_Enable referring to states of control signals /CE, CLE, ALE, /RE and the like. The input enable signal Din_Enable may indicate that an input of data may be activated. The input enable signal Din_Enable may be provided to the first ODT control circuit 170. The output enable signal Dout_Enable may indicate that an output of data may be activated. The output enable signal Dout_Enable may be provided to the second ODT control circuit 180. The decoder 160 may decode a strobe signal DQS and/or a read enable signal /RE provided from the input/output circuit 140. The decoder 160 may detect a falling edge of the strobe signal DQS to generate a DQS detection signal DQS_DET. The decoder 160 may detect a falling edge of the read enable signal /RE to generate a /RE detection signal /RE_DET.

The first ODT control circuit 170 may receive the ODT mode signal ODT_mode, the input enable signal Din_Enable, the write command flag signal W_CMD flag and the data strobe detection signal DQS_DET. Herein, the ODT mode signal ODT_mode, the input enable signal Din_Enable, the write command flag signal W_CMD flag, and the data strobe detection signal DQS_DET may be collectively referred to as a write operation status signal. However, it is well understood that the write operation status signal may be formed of, for example, two or three of the ODT mode signal ODT_mode, the input enable signal Din_Enable, the write command flag signal W_CMD flag, and the data strobe detection signal DQS_DET. The first ODT control circuit 170 may refer to the write operation status signal to activate the ODT circuit 150 connected with a data signal DQ and a strobe signal DQS at a write mode of operation.

The second ODT control circuit 180 may receive the ODT mode signal ODT_mode, the output enable signal Dout_Enable, the read command flag signal R_CMD flag, and the read enable detection signal /RE_DET from the decoder 160. Herein, the ODT mode signal ODT_mode, the output enable signal Dout_Enable, the read command flag signal R_CMD flag, and the read enable detection signal /RE_DET may be collectively referred to as a read operation status signal. However, it is well understood that the read operation status signal may be formed of, for example, the output enable signal Dout_Enable, the read command flag signal R_CMD flag, and the read enable detection signal /RE_DET. The second ODT control circuit 180 may refer to the read operation status signal to activate the ODT circuit 150 connected with a read enable signal /RE at a read mode of operation.

Although the ODT mode may be previously activated by a set feature command, the first and second ODT control circuits 170 and 180 may activate the ODT circuit 150 at a point of time where data may be substantially exchanged. The non-volatile memory device 100 according to at least one example embodiment of the inventive concepts may reduce power consumption by minimizing and/or reducing an active period of the ODT circuit 150.

Figure 4:
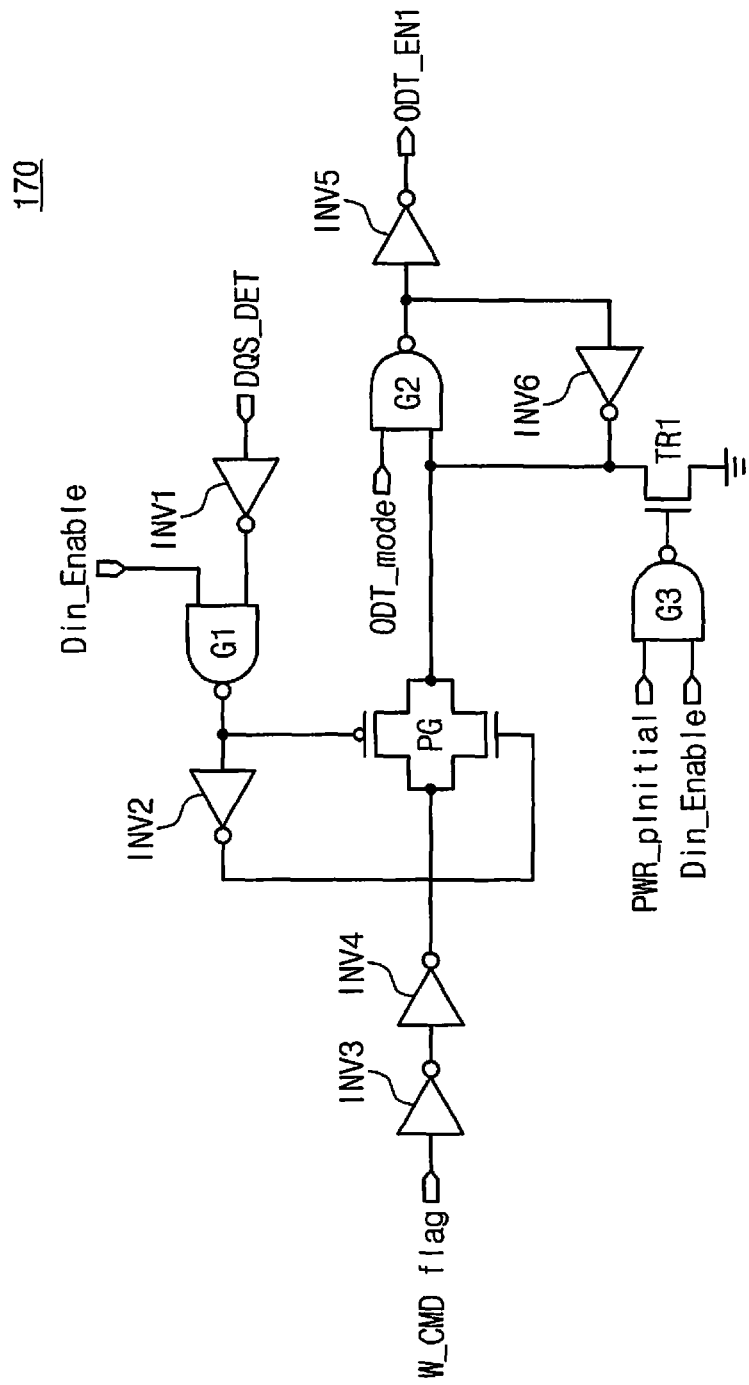

FIG. 4 is a circuit diagram illustrating first ODT control logic of FIG. 3 according to example embodiments of the inventive concepts. Referring to FIG. 4, a first ODT control circuit 170 may receive a write operation status signal from a decoder 160. The write operation status signal may include an ODT mode signal ODT_mode, an input enable signal Din_Enable, a write command flag signal W_CMD flag, and a DQS detection signal DQS_DET. A NAND gate G1 may receive the input enable signal Din_Enable and an inverted version of the DQS detection signal DQS_DET. A pass gate PG may be controlled by an output of the NAND gate G1. The pass gate PG may be turned on when the input enable signal Din_Enable is activated and simultaneously the DQS detection signal DQS_DET becomes logic '0'. The first ODT control circuit 170 may include inverters INV1-INV6.

The write command flag signal W_CMD flag and the ODT mode signal ODT_mode may be provided to a NAND gate G2. When the write command flag signal W_CMD flag is set to logic '1' and the ODT mode signal ODT_mode internally activated by a set feature command becomes logic '1', a first ODT control signal ODT_EN1 may be activated. A NAND gate G3 may be connected to receive a power enable signal PWR_pInitial and the input enable signal Din_Enable. The power enable signal PWR_pInitial may be a flag signal indicating that a power may be normally initialized at an initial operation.

An output of the NAND gate G3 may be provided to a gate of an NMOS transistor TR1. The write command flag signal W_CMD flag provided to the NAND gate G2 may be intercepted by the power enable signal PWR_pInitial and the input enable signal Din_Enable. When data input is ended, the input enable signal Din_Enable may be deactivated, and the NMOS transistor TR1 may be turned on by an output of the NAND gate G3. At the same time, the first ODT control signal ODT_EN1 may be inactivated, and the ODT circuit 150 may terminate the ODT mode.

A configuration of the first ODT control circuit 170 is described be example. However, it is well understood that the second ODT control circuit may be configured to be identical to the first ODT control circuit 170. The second ODT control circuit 180 may be configured by replacing the write command flag signal W_CMD flag, the input enable signal Din_Enable, the first ODT control signal ODT_EN1, and the DQS detection signal DQS_DET with a read command flag signal R_CMD flag, the output enable signal Dout_Enable, a second ODT control signal ODT_EN2, and a /RE detection signal /RE_DET, respectively.

Figure 5:
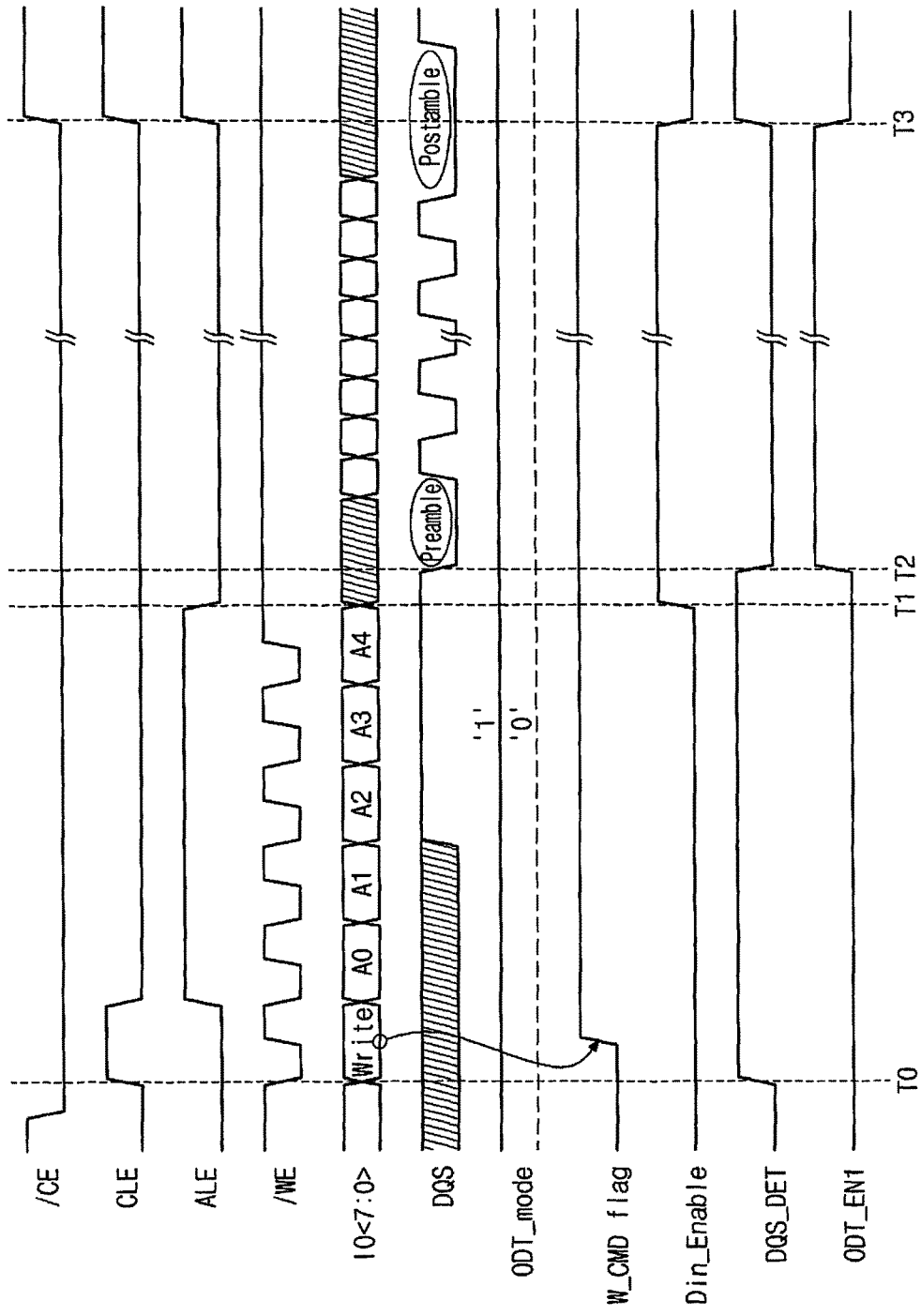

FIG. 5 is a timing diagram illustrating operation of a decoder 160 and a first ODT control circuit 170 of FIG. 3. Herein, it may be assumed that an ODT mode signal ODT_mode set via a set feature command is logic '1' in an active state. If a chip enable signal /CE is activated low and a command latch enable signal CLE transitions to a logic '1' at T0, a write command WRITE may be received in synchronization with a write enable signal /WE. A write command flag signal W_CMD flag may transition to logic '1' by an input of the write command WRITE. A level of the write command flag signal W_CMD flag thus set may be retained until a next command may be received.

If an input of the write command WRITE is completed, a control signal ALE may be activated, and address bits A0-A4 may be received until T1. Afterwards, an input enable signal Din_Enable may be activated high at T1 when the control signal ALE is deactivated. If an input of an address is ended, a strobe signal DQS may be activated at T2. If a preamble of the strobe signal DQS is detected, a DQS detection signal DQS_DET may transition to logic '0'. Under this condition, as illustrated in FIG. 4, a first ODT control circuit 170 may activate a first ODT control signal ODT_EN1. The input enable signal Din_Enable may be deactivated at T3 when any one of control signals /CE, CLE and ALE transitions. The first ODT control signal ODE_EN1 may be deactivated low (logic '0') in response to a deactivation of the input enable signal Din_Enable. T3 may correspond to a postamble of the strobe signal DQS.

Figure 6:
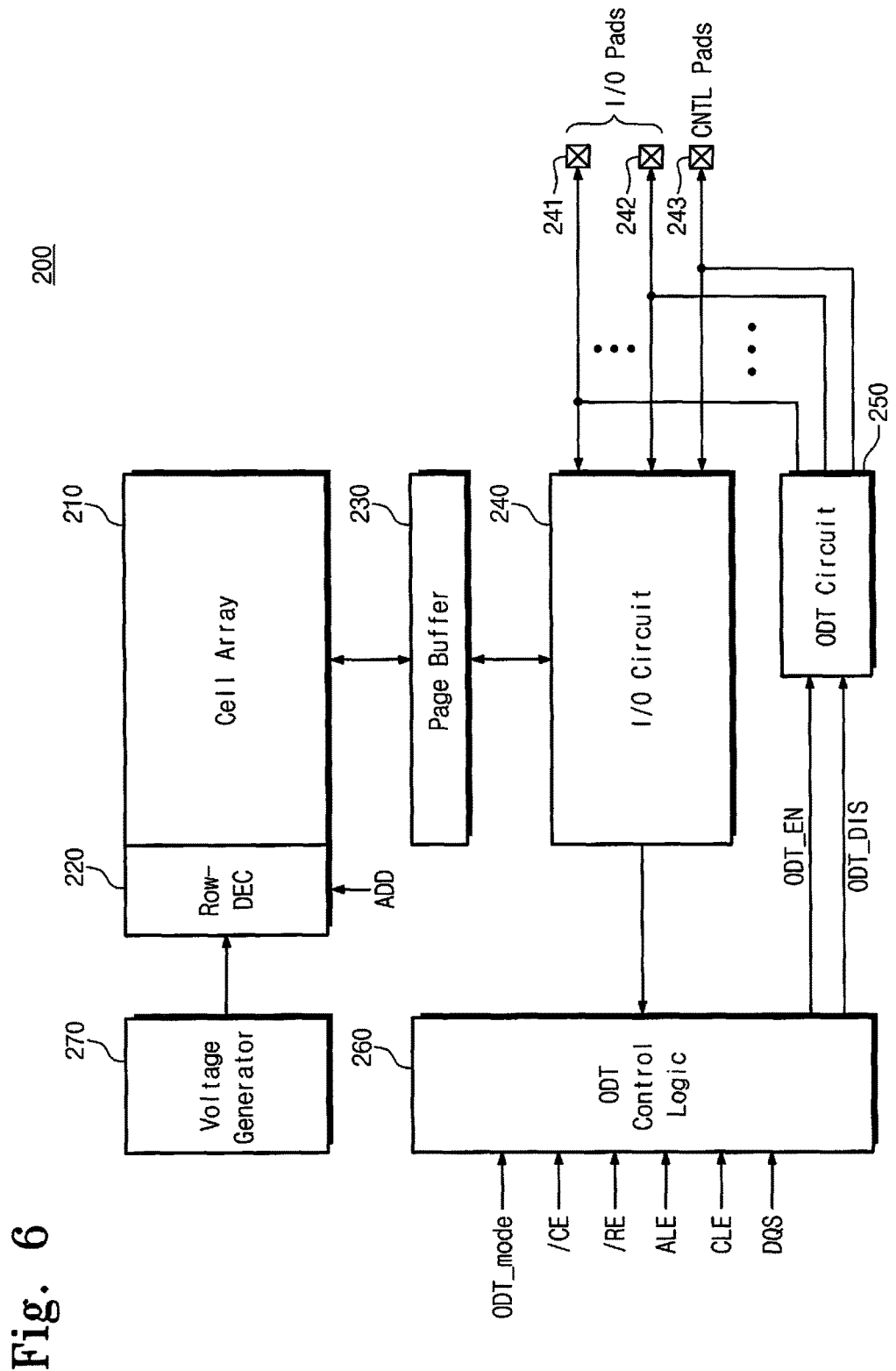

FIG. 6 is a block diagram illustrating non-volatile memory devices according to other example embodiments of the inventive concepts. Referring to FIG. 6, a non-volatile memory device 200 may include a cell array 210, a row decoder 220, a page buffer 230, an input/output circuit 240, an ODT circuit 250, ODT control logic 260, and a voltage generator 270. The cell array 210 may include a plurality of non-volatile memory cells, each of which may be connected with a bit line and a word line. Data of plural bits may be stored in each memory cell being a multi-level cell. In case of a NAND flash memory, the cell array 210 may include NAND cell strings, each of which may form a vertical or horizontal channel. Where the cell array 210 is formed of a vertical NAND flash structure, a plurality of word lines may be stacked in a vertical direction. Each word line may form control gates of memory cells in a cell string. A memory cell channel may be formed in a vertical direction.

The row decoder 220 may decode an address ADD to select one of word lines of the cell array 210. The row decoder 220 may supply a selected word line of the cell array 210 with a word line voltage that may be provided from a voltage generator 270. For example, at a write mode of operation, the row decoder 220 may supply a selected word line with a program voltage and unselected word lines with a pass voltage. The row decoder 220 may provide a selection voltage to selection lines SSL and GSL. The page buffer 230 may operate as a write driver and/or a sense amplifier according to a mode of operation. At a write operation, the page buffer 230 may transfer a voltage corresponding to data to be programmed to a bit line of the cell array 210. At a read operation, the page buffer 230 may sense data stored in a selected memory cell to transfer the sensed data to the input/output circuit 240.

The input/output circuit 240 may transfer input data to the page buffer 230 and/or data from the page buffer to an external device. The input/output circuit 240 may transfer an input command and/or control signals to the ODT control logic 260. The input/output circuit 240 may include an input buffer and an output buffer although not illustrated in FIG. 6. The ODT circuit 250 may adjust impedance corresponding to input/output lines. The ODT circuit 250 may perform an ODT operation in response to an ODT control signal ODT_EN from the ODT control logic 260. The ODT circuit 250 may adjust the impedance between the input/output circuit 240, and pads 241, 242, and 243 when the ODT control signal ODT_EN is received. If the ODT control signal ODT_EN is activated, the ODT circuit 250 may be driven such that the input or output impedance corresponding to respective pads 241, 242 and 243 is adjusted to a target value.

The ODT control logic 260 may control the ODT circuit 250 referring to a command that may be received via the input/output circuit 240, control signals ICE, /RE, ALE, CLE, and DQS that may be received via control pins, and an ODT mode signal ODT_mode set by a set feature command. When the received command CMD and control signals /CE, /RE, ALE, CLE, and DQS satisfy a specific condition, the ODT control logic 260 may output the ODT enable signal ODT_EN activating the ODT circuit 250. On the other hand, when the received command CMD and control signals /CE, /RE, ALE, CLE, and DQS do not satisfy a specific condition, the ODT control logic 260 may output an ODT disable signal ODT_DIS deactivating the ODT circuit 250.

The voltage generator 270 may generate word line voltages to be supplied to word lines and a voltage for biasing a bulk (e.g., a well region) where memory cells may be formed. Word line voltages to be supplied to word lines may include a program voltage, a pass voltage, a read voltage and/or the like. With the non-volatile memory device 200 according to example embodiments of the inventive concepts, an activation of the ODT circuit 250 may be limited to a point of time when data input/output is made. It may be possible to minimize and/or reduce power consumption caused according to an activation of the ODT circuit 250.

Figure 7:
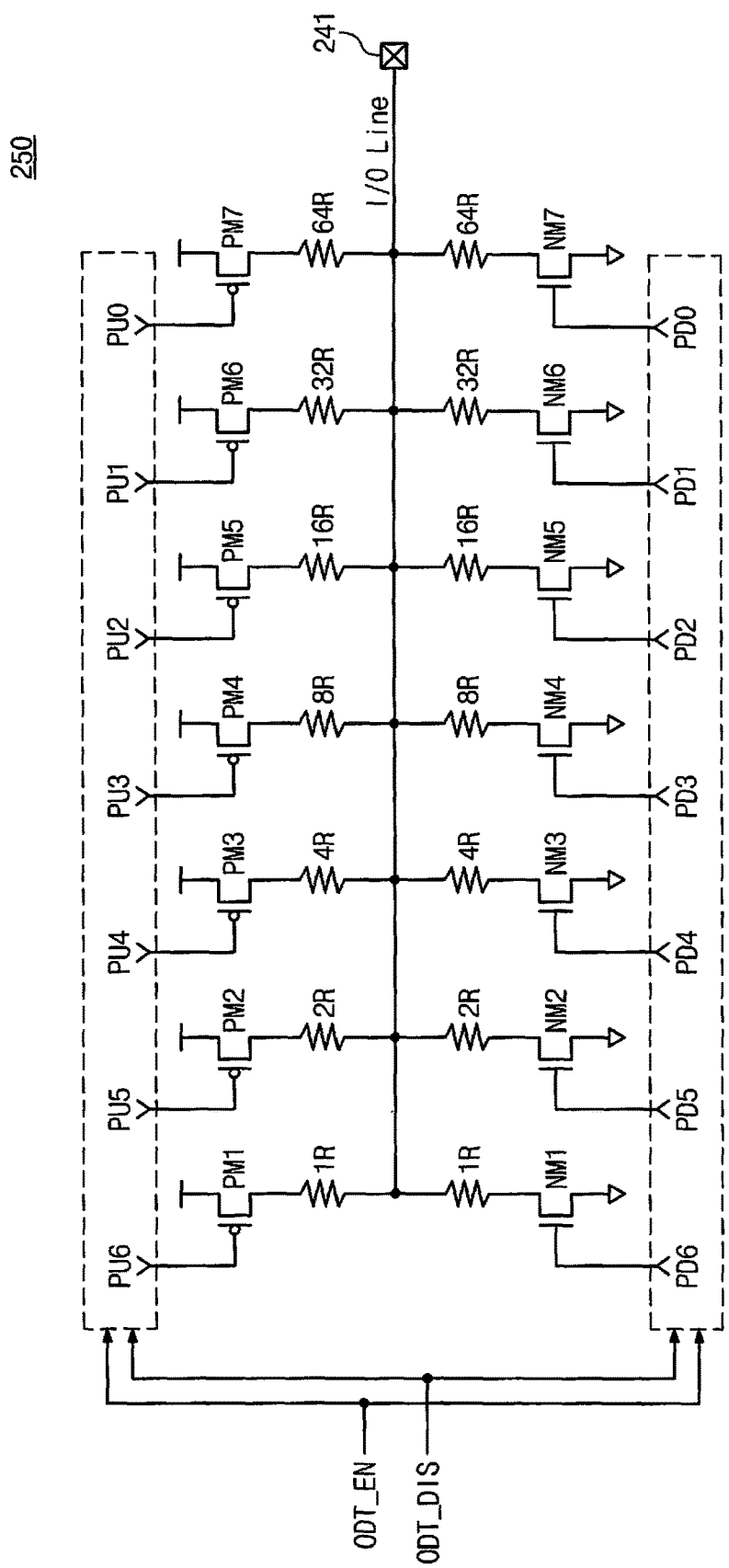

FIG. 7 is a circuit diagram illustrating an ODT circuit of FIG. 6 according to example embodiments of the inventive concepts. Referring to FIG. 7, an ODT circuit 250 may include a plurality of resistors and a plurality of switches PM1-PM7 and NM1-NM7 for adjusting the impedance of an input/output line (I/O Line) that may be connected with an input/output pad 241. ODT control codes for controlling switches may be provided to gates of the switches. If an ODT enable signal ODT_EN is activated, ODT control codes PU0-PU6 may be provided to pull-up switches PM1-PM7. Pull-up resistors (e.g., 1R, 2R, 4R, 8R, 16R, 32R and 64R) may be set to have a selected resistance value. If ODT control codes PD0-PD6 are provided to pull-down switches NM1-NM7, a size of pull-down resistors may be adjusted. If the ODT disable signal ODT_DIS is activated, supplying of the ODT control codes PU0-PU6 and PD0-PD6 to the switches PM1-PM6 and NM1-NM7 may be interrupted. An impedance value may be recovered to a general impedance value instead of a termination impedance value for the ODT mode.

Figure 8:
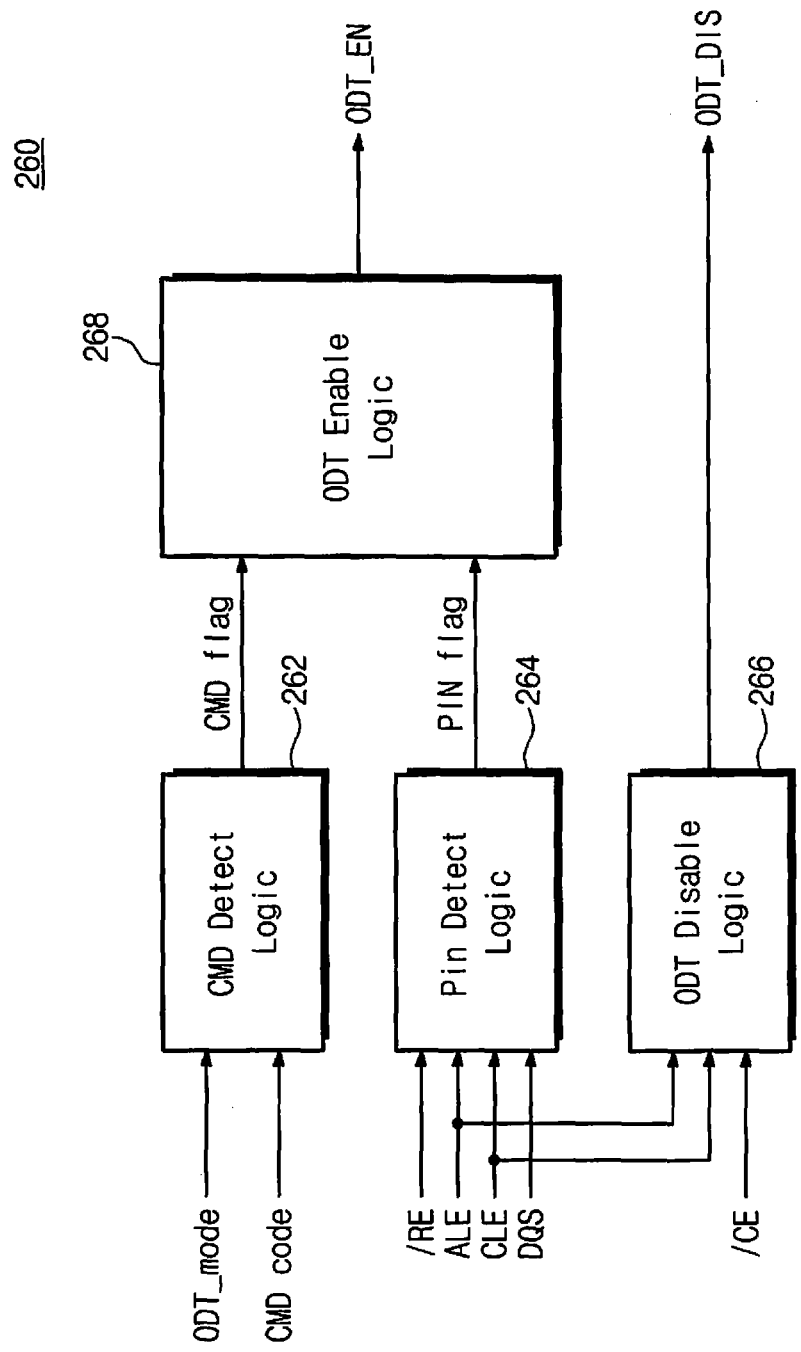

FIG. 8 is a block diagram illustrating ODT control logic of FIG. 6 according to example embodiments of the inventive concepts. Referring to FIG. 8, ODT control logic 260 may include command detect logic 262, pin detect logic 264, ODT disable logic 266 and ODT enable logic 268. The command detect logic 262 may detect a read and/or write command for activating an ODT circuit 250. The command detect logic 262 may receive an ODT mode signal ODT_mode which may be set according to execution of a set feature command. The command detect logic 262 may receive a command code CMD code provided from an input/output circuit 240. The command code CMD code may correspond to a code value which may be received via an I/O pad at a point of time when a command latch enable signal CLE may be activated. Under the condition that the ODT mode signal ODT_mode is activated, the command detect logic 262 may output a command flag signal CMD flag according to a command code value.

For example, when a general read command 00h-30h is received, the command detect logic 262 may activate the command flag signal CMD flag in order to provide an input control signal (e.g., /RE) as an ODT enable mode. According to at least one example embodiment, after a general read command 00h-30h is received, the command detect logic 262 may activate the command flag signal CMD flag when an input of an address is completed. The command detect logic 262 may activate the command flag signal CMD flag when a program command 80h or 85h may be received in synchronization with the command latch enable signal CLE. The ODT enable logic 268 may activate the ODT mode on a strobe signal pin and data input/output pins. The command detect logic 262 may not respond to a read command which may not require high reliability of data. For example, the command detect logic 262 may output the command flag signal CMD flag of an inactive state when a status read command 70h is received.

The pin detect logic 264 may detect control signals /RE, ALE, CLE and DQS received via pins and may output a pin flag signal PIN flag indicating whether or not the ODT circuit 250 may be activated. When a falling edge of a read enable signal /RE is detected at a read operation, the pin detect logic 264 may retain an active state of the pin flag signal PIN flag during a target period. The pin detect logic 264 may detect a preamble period where control signals ALE, CLE, and DQS may be maintained at logic '0' at a write operation, and may make the pin flag signal PIN flag transition to an active state according to the detect result.

The ODT disable logic 266 may detect variations of control signals /CE, ALE and CLE to disable the activated ODT circuit 250. For example, if the chip enable signal ICE transitions to logic '1' at a read or write mode of operation, the ODT disable logic 266 may output the ODT disable signal ODT_DIS for deactivating the ODT circuit 250. If any one of the command latch enable signal CLE and the address latch enable signal ALE transitions to logic '1' at a read and/or write mode of operation, the ODT disable logic 266 may output the ODT disable signal ODT_DIS for deactivating the ODT circuit 250. The ODT enable logic 268 may activate or deactivate the ODT enable signal ODT_EN according to logical values of the command flag signal CMD flag and the pin flag signal PIN flag. For example, the ODT enable logic 268 may logically combine the signals CMD flag and PIN flag via an AND gate and may output the ODT enable signal ODT_EN as a logically combined result.

The ODT control logic 260 may control the ODT circuit 250 according to a command code and states of control pins. The non-volatile memory device 200 may activate the ODT circuit 250 by a minimum time needed to secure data reliability. The non-volatile memory device 200 may transfer data at a high speed, may secure the data reliability and may reduce power consumption.

Figure 9:
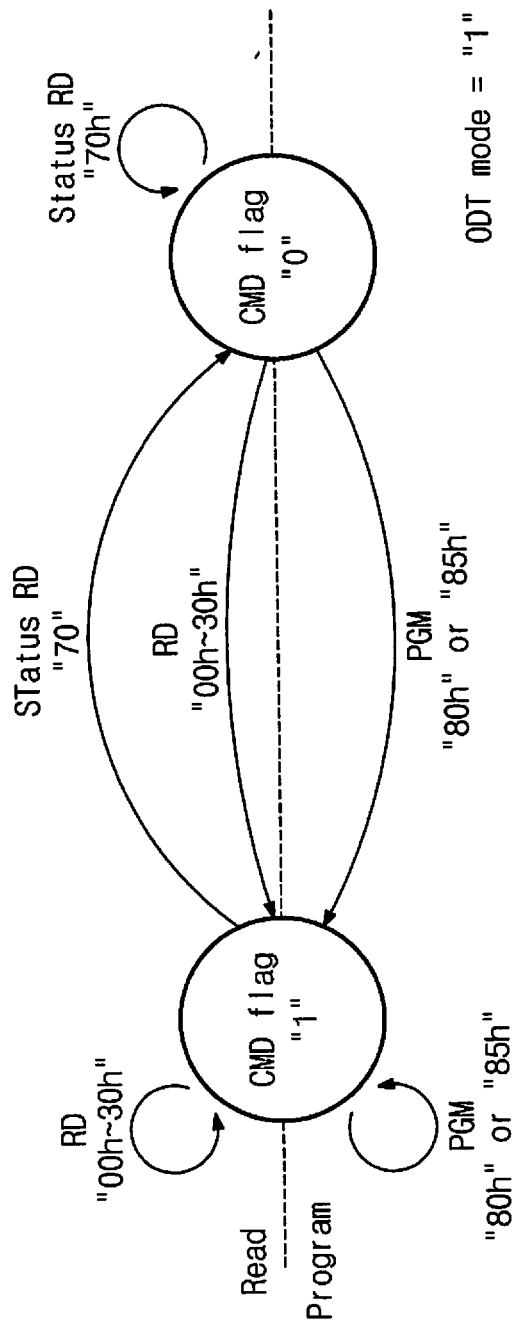

FIG. 9 is a state diagram illustrating operation of command detect logic of FIG. 8 according to example embodiments of the inventive concepts. Herein, it may be assumed that an ODT mode signal ODT_mode provided according to execution of a set feature command is logic '1'. Referring to FIG. 9, as an output of the command detect logic 262, a command flag signal CMD flag may be in a logic '1' or '0' state. A logic '1' state of the command flag signal CMD flag may indicate that the command flag signal CMD flag is active. A logic '0' state may indicate that the command flag signal CMD flag is inactive.

A status transition will be described under the condition that a current command flag signal CMD flag is a logic '1' state. It may be assumed that a command code provided from an input/output circuit 240 may be '00h'. The '00h' command may correspond to a read mode RD. The command flag signal CMD flag may retain the logic '1' state. If a command code is '70h' indicating a status read command Status RD unnecessary for activation of an ODT mode, the command flag signal CMD flag may transition to a logic '0' state. If a command code provided from the input/output circuit 240 is '80h' (serial data input) and/or '85h' (random data input) corresponding to a write command, the command flag signal CMD flag may maintain the logic '1' state. If a current command code is '70h' corresponding to a status read command Status RD unnecessary for activation of the ODT mode, the command flag signal CMD flag may retain the logic '1' state.

A command code received via the input/output circuit 240 may be '00h' corresponding to a read mode, with the command flag signal CMD flag being in a logic '1' state. The command flag signal CMD flag may retain a logic '1' state. If a command code is '70h' corresponding to a status read command Status RD unnecessary for activation of the ODT mode, the command flag signal CMD flag may transition to a logic '0' state. If a command code is a write and/or read command, the command flag signal CMD flag may transition to a logic '1' state.

The command flag signal CMD flag may be a logic '0' state. If a command code provided from the input/output circuit 240 (refer to FIG. 6) is '00h' corresponding to a read mode, the command flag signal CMD flag may transition to a logic '1' state. If a command code is '70h' corresponding to a status read command Status RD unnecessary for activation of the ODT mode, the command flag signal CMD flag may retain a logic '0' state.

If a command code provided from the input/output circuit 240 is '80h' (serial data input) or '85h' (random data input) corresponding to a write command, the command flag signal CMD flag may transition to a logic '1' state.

An operation of the command detect logic 262 may be described by example according to a specific command code. However, example embodiments of the inventive concepts are not limited to these examples. Specific command codes are used for clarity and not to limit example embodiments.

Figure 10:
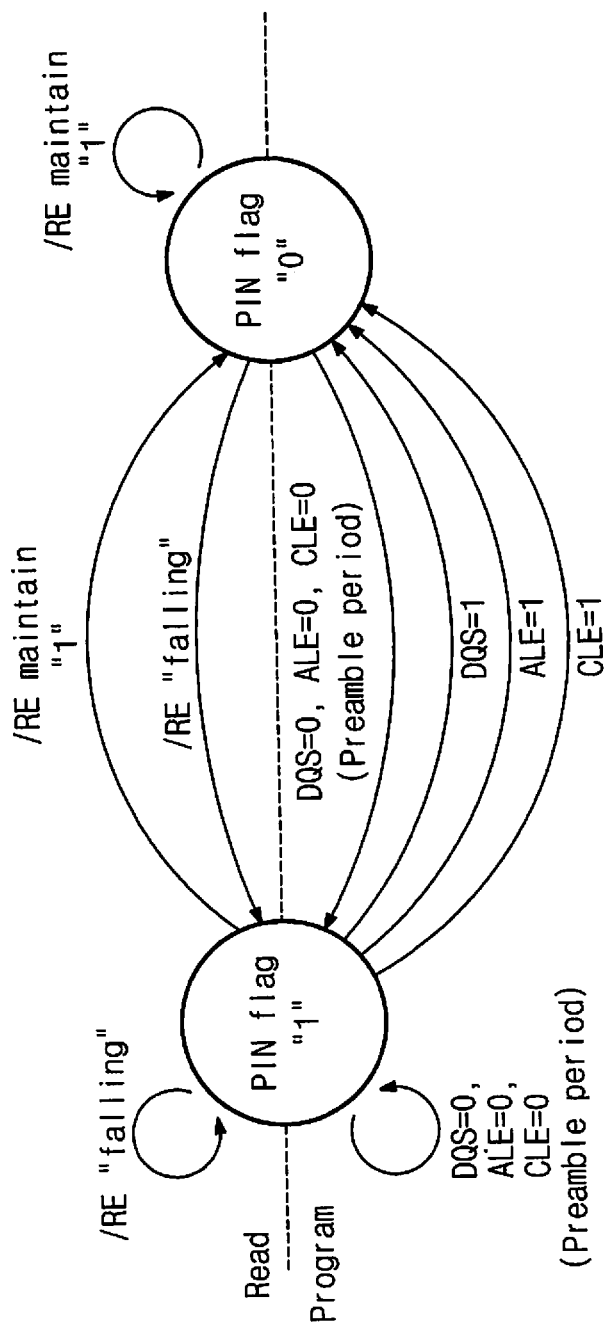

FIG. 10 is a state diagram illustrating operation of pin detect logic of FIG. 8 according to example embodiments of the inventive concepts. Referring to FIG. 10, an operation of pin detect logic 264 according to variations of control signals /RE, ALE, CLE and DQS may be illustrated.

A pin flag signal PIN flag may be an output of pin detect logic 264 with a logic '1' state. Where a read enable signal /RE is activated (upon falling of the /RE), the pin flag signal PIN flag may retain a logic '1' state. If control signals DQS, ALE, and CLE are detected to be logic '0' at the same time within a preamble period at a write operation, the detected result may indicate that valid data is received. The pin detect logic 264 may maintain the pin flag signal PIN flag at a logic '1' state. If a logic '1' state of a read enable signal /RE is maintained over a target period with the pin flag signal PIN flag having a logic '1' state, the pin flag signal PIN flag may transition to a logic '0' state. If any one of control signals DQS, ALE, and CLE rises to logic '1' with the pin flag signal PIN flag having a logic '1' state, the pin flag signal PIN flag may transition to a logic '0' state.

The pin flag signal PIN flag may be an output of the pin detect logic 264 with a logic '0' state. If a read enable signal /RE maintains a logic '1' state over a specific period, the pin flag signal PIN flag may maintain a logic '0' state. If the read enable signal /RE is activated (upon the falling of /RE), the pin flag signal PIN flag may transition to a logic '1' state via the pin detect logic 264. If control signals DQS, ALE and CLE are detected to be logic '0' at the same time within a preamble period at a write operation, the pin flag signal PIN flag may transition to a logic '1' state via the pin detect logic 264.

An operation of the pin detect logic 264 is described by example using variations of control signals /RE, ALE, CLE and DQS. However, it may be possible to describe the pin detect logic 264 by a combination of various control signals directing an input/output of valid data. Example embodiments are not limited to the specific control signals used for purposes of explanation herein.

Figure 11:
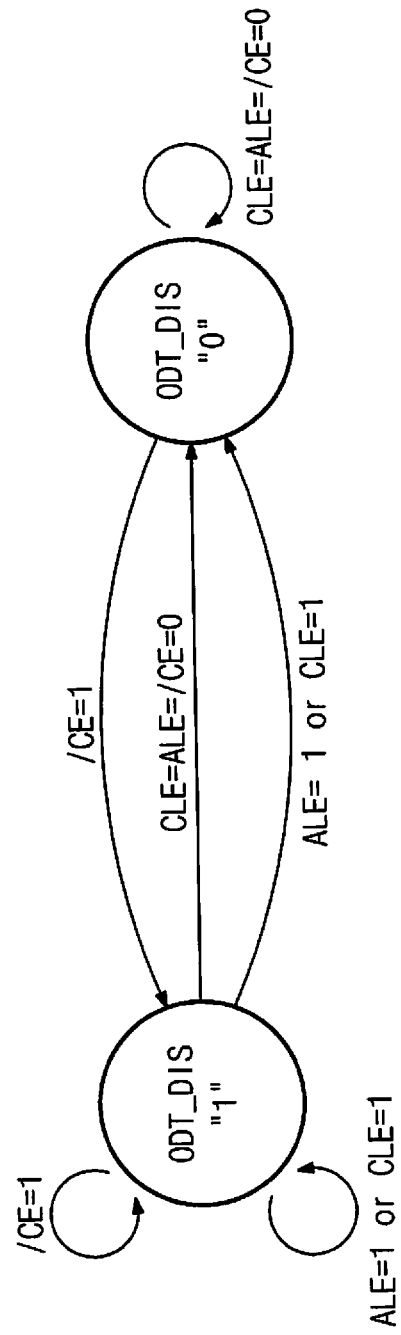

FIG. 11 is a state diagram illustrating operation of ODT disable logic of FIG. 8 according to example embodiments of the inventive concepts. Referring to FIG. 11, a control operation of ODT disable logic 266 according to variations of control signals ICE, ALE and CLE may be illustrated.

A logic value of an ODT disable signal ODT_DIS being an output of the ODT disable logic 266 may be '1'. In this case, an ODT circuit 250 may terminate an ODT mode. If a chip enable signal /CE is at logic '1' at this condition, the ODT disable signal ODT_DIS may retain a logic '1' state. Although at least one of control signals ALE and CLE may transition to a logic '1' state with the ODT disable signal ODT_DIS being in a logic '1' state, the ODT disable signal ODT_DIS may maintain a logic '1' state. If the control signals /CE, ALE, and CLE are detected to be '0' with the ODT disable signal ODT_DIS being in a logic '1' state, the ODT disable signal ODT_DIS may transition to a logic '0' state.

The ODT disable signal ODT_DIS may be in a logic '0' state. Under this condition, if the chip enable signal /CE is detected to be '1', the ODT disable signal ODT_DIS may transition to a logic '1' state. Although at least one of the control signals ALE and CLE may transition to a logic '1' state with the ODT disable signal ODT_DIS being in a logic '0' state, the ODT disable signal ODT_DIS may transition to a logic '1' state. If the control signals /CE, ALE, and CLE are detected to be '0' with the ODT disable signal ODT_DIS being in a logic '1' state, the ODT disable signal ODT_DIS may retain a logic '0' state.

An operation of the ODT disable logic 266 of detecting variations of control signals /CE, ALE and CLE and inactivating the ODT circuit 250 is described be example. It is possible to implement the ODT disable logic 266 variously via design change so as to activate the ODT circuit 250 within a minimum period of a data input/output period.

Figure 12:
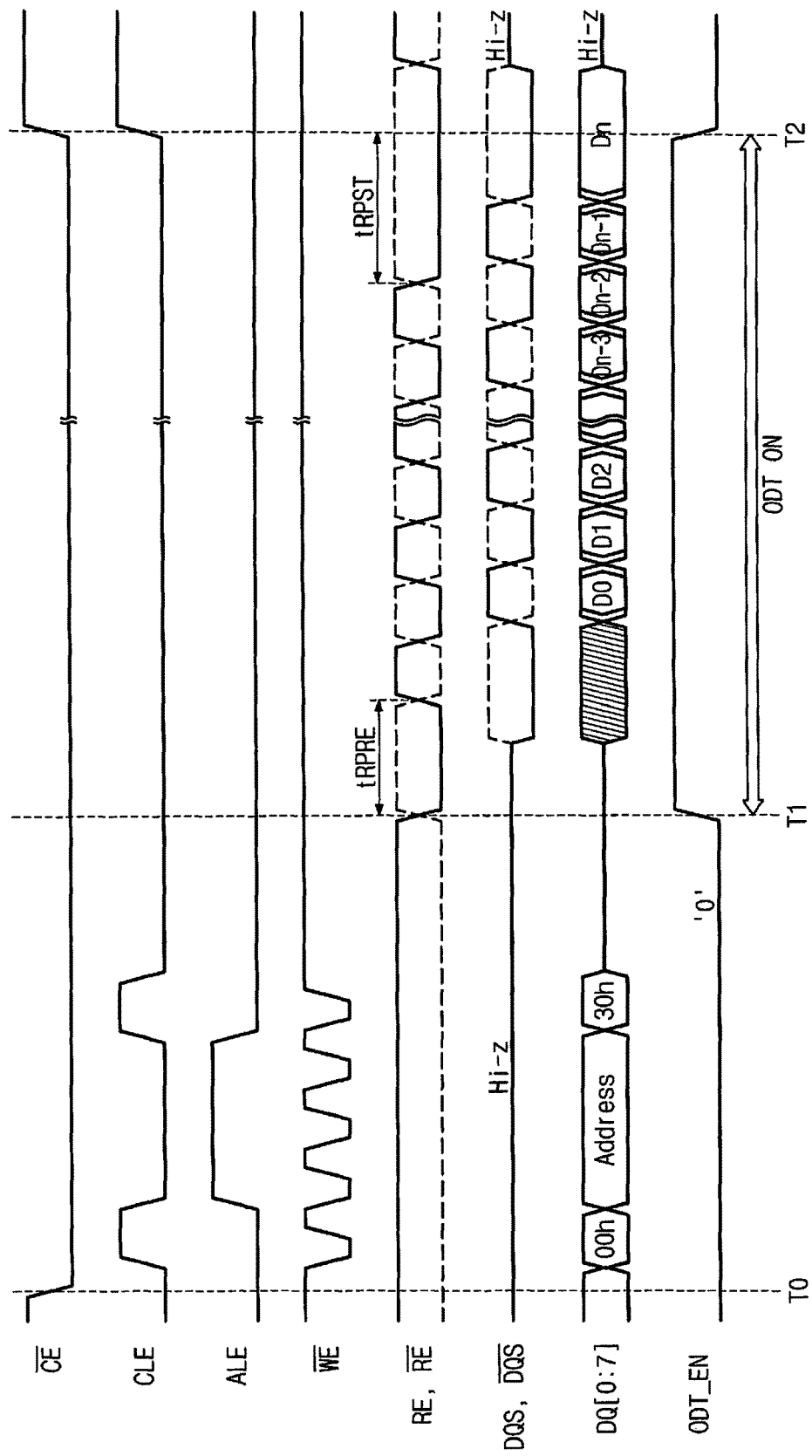

FIG. 12 is a timing diagram illustrating read operations of non-volatile memory devices according to still other example embodiments of the inventive concepts. Referring to FIG. 12, an operation of an ODT circuit which may be controlled according to an input of a read command and a read enable signal may be illustrated. An ODT mode signal ODT_mode set by a set feature command may be logic '1'. At T0, a read command (e.g., 00h, 30h) may be received in synchronization with a write enable signal /WE. A command and an address received via an input/output stage may be latched by a command latch enable signal CLE and an address latch enable signal ALE. A command flag signal CMD flag (not shown) may be activated according to the read command 00h and 30h.

If a falling edge of the read enable signal /RE is detected, pin detect logic 264 (refer to FIG. 8) may activate a pin flag signal PIN flag. ODT enable logic 268 (refer to FIG. 8) may activate an ODT circuit 250 (refer to FIG. 6). If the ODT circuit 250 is activated at a read mode of operation, an ODT operation on the read enable signal /RE may be supported. At T2 where the chip enable signal /CE may be inactivated, an ODT enable signal ODT_En may be inactivated. Accordingly, the ODT circuit 250 may be disabled at T2.

Figure 13:
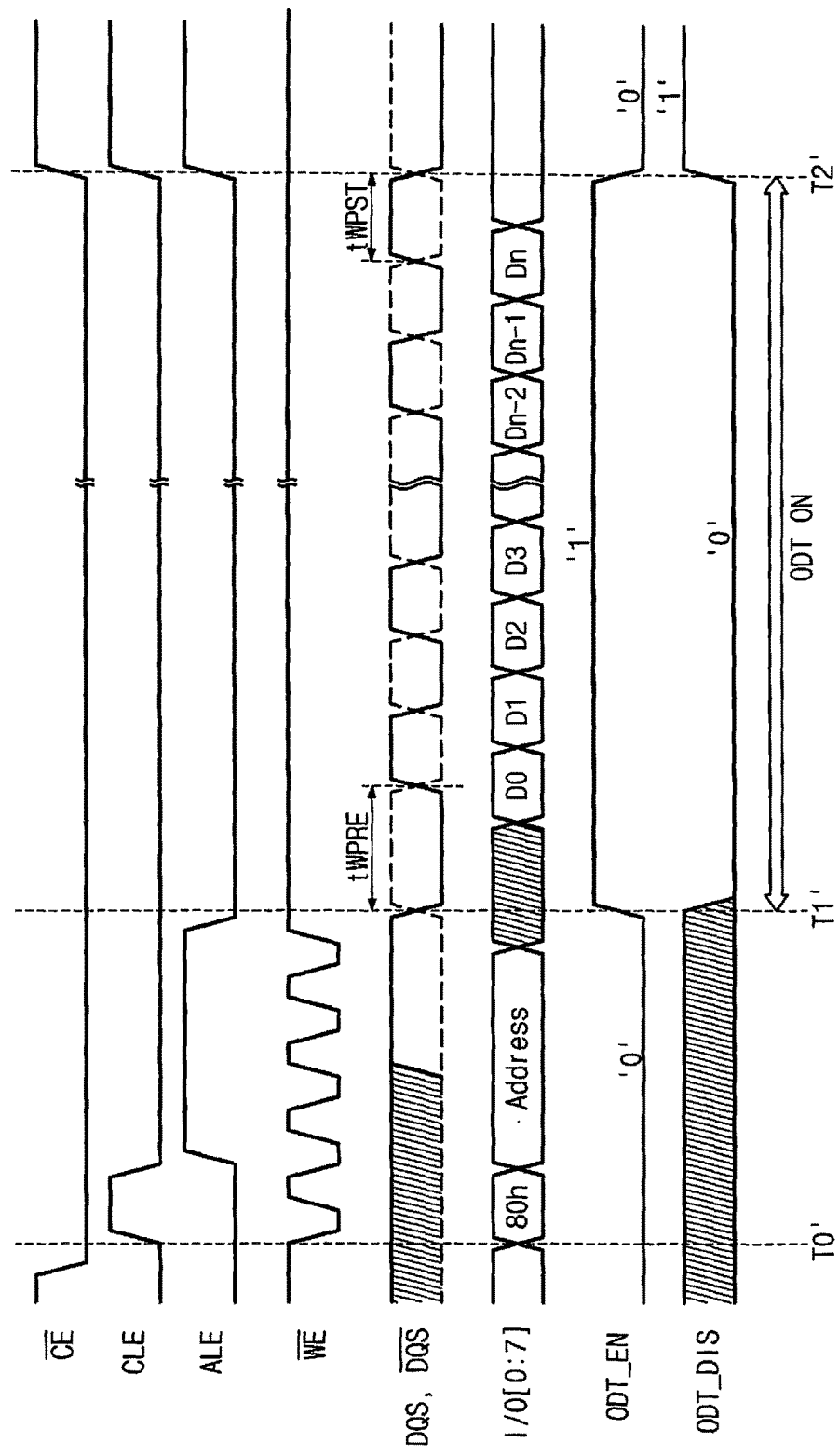

FIG. 13 is a timing diagram illustrating write operations of non-volatile memory devices according to still other example embodiments of the inventive concepts. Referring to FIG. 13, there may be described an operation of an ODT circuit which may be controlled according to an input of a write command and a strobe signal DQS.

An ODT mode signal ODT_mode set by a set feature command may be logic '1'. At T0', a write command (for example, 80h) may be received in synchronization with a write enable signal /WE. A command and an address received via an input/output stage may be latched by a command latch enable signal CLE and an address latch enable signal ALE. If the write command 80h is latched, command detect logic 262 (refer to FIG. 8) may activate a command flag signal CMD flag (not shown).

If control signals CLE and ALE transition to logic '0' and a strobe signal DQS is falling, pin detect logic 264 (refer to FIG. 8) may activate a pin flag signal PIN flag. An ODT enable signal ODT_EN may be activated by activations of signals CMD flag and PIN flag. The ODT disable logic 266 may make the ODT disable signal ODT_DIS transition to a logic '0' state. This may enable the ODT circuit 250 (refer to FIG. 6) to be turned on at T1'. There may be activated an ODT mode on a DQS pin and I/O pins for receiving write data at a write operation.

After an input of write data is ended, any one of the control signals /CE, ALE and CLE may transition to logic '1' at T2'. At this time, the ODT disable logic 266 may make' the ODT disable signal ODT_DIS transition to logic '1'. This means that the ODT circuit 250 may be inactivated and the ODT mode on the I/O and DQS pins may be terminated.

Figure 14:
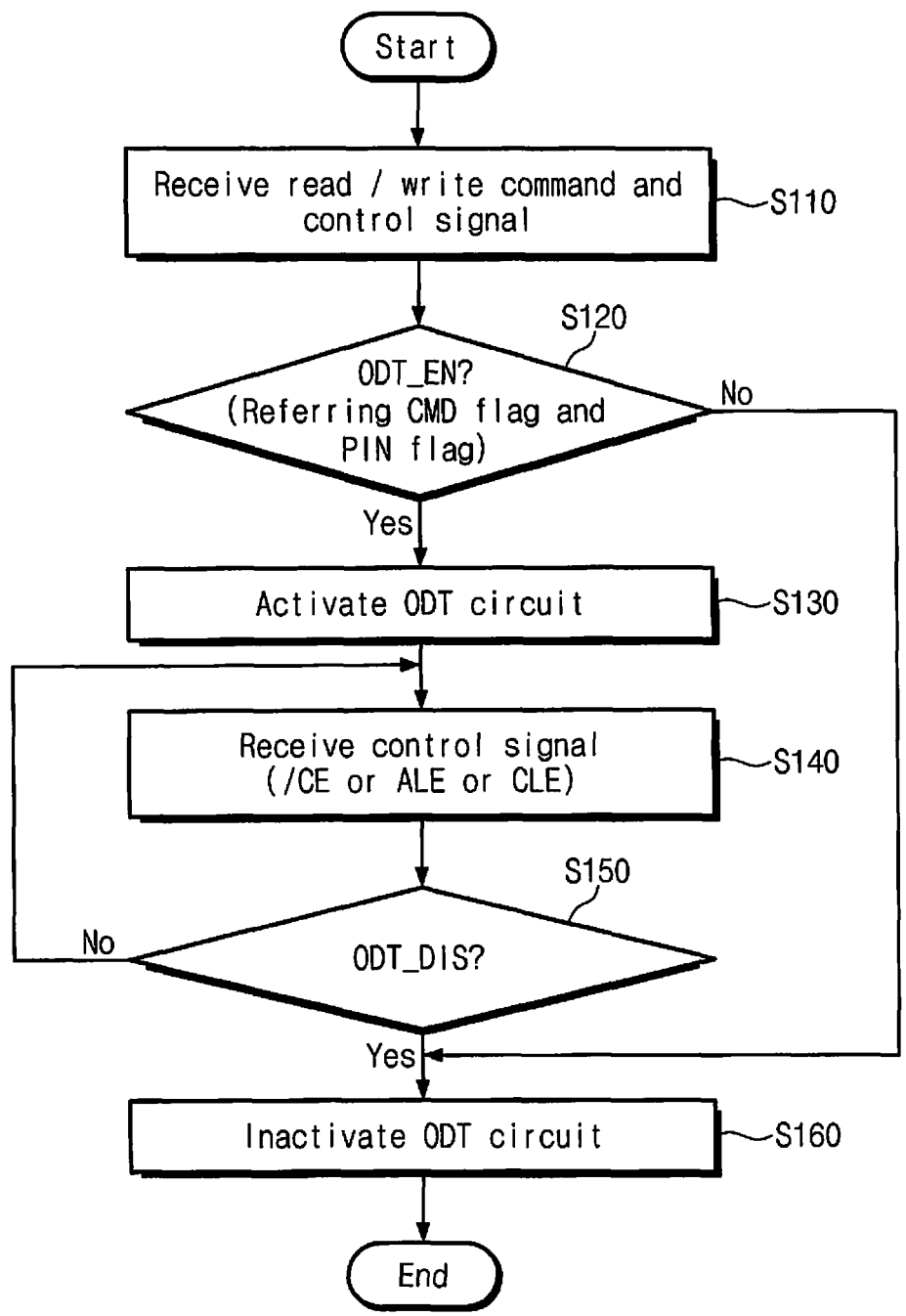

FIG. 14 is a flowchart illustrating control methods for an ODT circuit in ODT control logic of FIG. 6. Referring to FIGS. 6-8 and 14, in step S110, ODT control logic 260 (refer to FIG. 6) may receive control signals and a command provided via an input/output circuit 240 (refer to FIG. 6). A read or write command may be provided as a command code (e.g., '00h' or '80h') value received at I/O pins. Such commands may be provided to the input/output circuit 240 in synchronization with a command latch enable signal CLE. Control signals may be provided to the input/output circuit 240 via control signal pins. The input/output circuit 240 may transfer received control signals /RE, ALE, CLE, DQS, /CE and /WE to ODT control logic 260.

In step S120, command detect logic 262 in the ODT control logic 260 may decode received command code CMD code to output a command flag signal CMD flag. Pin detect logic 264 may detect variations of control signals /RE, ALE, CLE and DQS to output a pin flag signal PIN flag. ODT enable logic 268 may output an ODT enable signal ODT_EN referring to values of a command flag signal CMD flag and the pin flag signal PIN flag. If the ODT enable signal ODT_EN is at an inactive state (NO), the method may proceed to step S160, in which the ODT circuit 250 may be maintained in a turned-off state. If the ODT enable signal ODT_EN is at an active state (YES), the method may proceed to step S130, in which the ODT circuit 250 may be turned on.

In step S130, as the ODT enable signal ODT_EN is activated, the ODT circuit 250 may be turned on at a point of time corresponding to a preamble. ODT resistance corresponding to input/output data and/or a strobe signal DQS and/or /RE may be adjusted to a target value. In step S140, during data exchange, the ODT control logic 260 may receive control signals /CE, ALE and CLE. The control signals /CE, ALE and CLE received via control pins may be transferred to the ODT control logic 260 via the input/output circuit 240.

In step S150, the ODT control logic 260 may monitor variations of provided control signals /CE, ALE and CLE. The ODT disable logic 266 in the ODT control logic 260 may detect whether any one of the control signals /CE, ALE and CLE may transition to a logic '1' state. If any one of the control signals /CE, ALE and CLE transitions to a logic '1' state, the ODT disable logic 266 may activate the ODT disable signal ODT_DIS. At step S160, the ODT circuit 250 may be turned off. If the control signals /CE, ALE and CLE maintain a logic '0' state, the ODT disable logic 266 may maintain the ODT disable signal ODT_DIS in an inactive state. The method may proceed to step S140, in which a turn-on state of the ODT circuit 250 may be maintained and control signals /CE, ALE, and CLE may be received.

The ODT control logic 260 may activate an ODT mode within an operating period in which data may be exchanged essentially, based on a command and control signals. The ODT circuit 250 may be turned on at a preamble where data transfer commences. The ODT circuit 250 may be turned off at a postamble where data transfer ends.

Figure 15:
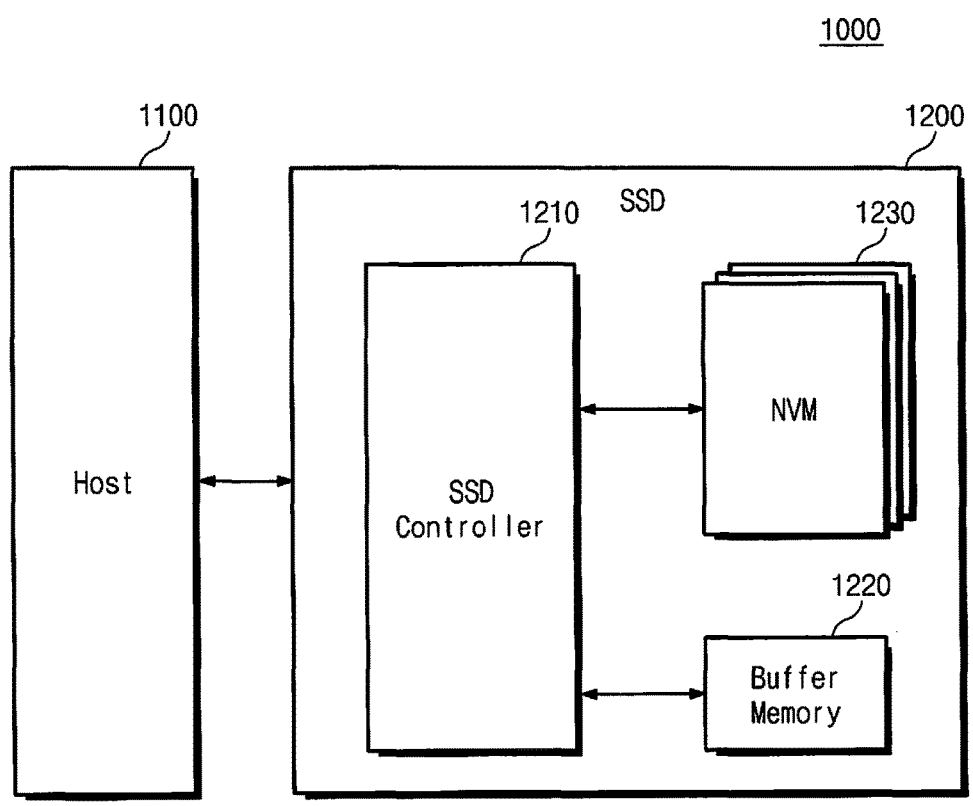

FIG. 15 is a block diagram illustrating solid state disk (SSD) systems according to example embodiments of the inventive concepts. Referring to FIG. 15, a solid state disk (SSD) system 1000 according to at least one example embodiment of the inventive concepts may include a host 1100 and a SSD 1200. The SSD 1200 may include an SSD controller 1210, a buffer memory 1220 and a non-volatile memory device 1230.

The SSD controller 1210 may be connected physically with the host 1100 and the SSD 1200. The SSD controller 1210 may provide an interface with the SSD 1200 so as to correspond to a bus format of the host 1100. The SSD controller 1210 may decode a command provided from the host 1100. The SSD controller 1100 may access the non-volatile memory device 1230 according to a decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and/or the like.

The buffer memory 1220 may temporarily store write data provided from the host 1100 and/or data read out from the non-volatile memory device 1230. Where data in the non-volatile memory device 1230 may be cached at a read request of the host 1100, the buffer memory 1220 may support a cache function that may provide cached data directly to the host 1100. In general, a data transfer speed by a bus format (e.g., SATA and/or SAS) of the host 1100 may be by faster as compared with a transfer speed of a memory channel of the SSD 1200. Where an interface speed of the host 1100 is by far higher, it may be possible to minimize and/or reduce performance lowering caused due to a speed difference by providing a large-volume buffer memory 1220. The buffer memory 1220 may be formed of a synchronous DRAM to provide sufficient buffering at the SSD 1200 used as a large-volume auxiliary storage device. However, it is well understood that the buffer memory 1220 may not be limited in this disclosure.

The non-volatile memory device 1230 may be provided as storage media of the SSD 1200. For example, the non-volatile memory device 1230 may be formed of a NAND-type flash memory with a large-volume storage capacity. The non-volatile memory device 1230 may be formed of a plurality of memory devices. In this case, each memory device may be connected with the SSD controller 1210 by a channel unit. As one example, the non-volatile memory device 1230 as storage media may be formed of a NAND flash memory. The storage media may be formed of other non-volatile memory devices. For example, the storage media may be formed of PRAM, MRAM, ReRAM, FRAM, NOR flash memory, and/or the like. A memory system using other memory devices may be applied to the storage media. The storage media may be formed of a volatile memory device (e.g., DRAM).

The non-volatile memory device 1230 may activate an ODT mode during a period where data is exchanged essentially based on a command and control signals, for example, according to example embodiments described with respect to FIGS. 1-14. It may be possible to provide high and/or increased speed performance via the non-volatile memory device 1230 and to configure a high and/or increased reliability and low and/or reduced power SSD system 1000.

Figure 16:
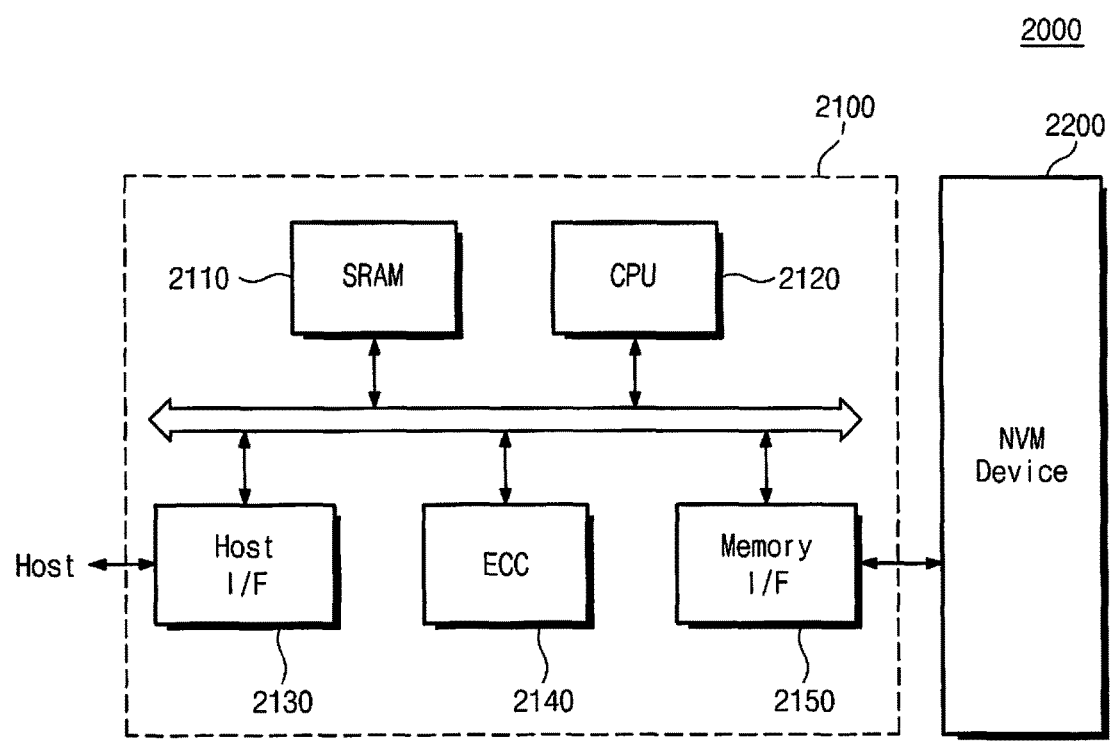

FIG. 16 is a block diagram illustrating memory systems according to example embodiments of the inventive concepts. Referring to FIG. 16, a memory system 2000 according to at least one example embodiment may include a non-volatile memory device 2200 and a memory controller 2100. The memory controller 2100 may be configured to control the non-volatile memory device 2200. The memory controller 2100 and the non-volatile memory device 2200 may constitute a memory card. SRAM 2110 may be used as a work memory of a processing unit 2120. A host interface 2130 may have the data exchange protocol of a host connected with the memory system 2000. An ECC block 2140 may detect and correct errors included in data read out from the non-volatile memory device 2200. A memory interface 2150 may interface with the non-volatile memory device 2200. The processing unit 2120 may be configured to control an overall operation for data exchange of the memory controller 2100. Although not illustrated in FIG. 16, the memory system 2000 according to at least one example embodiment of the inventive concepts may include ROM (not shown) to store code data for interfacing with the host.

The non-volatile memory device 2200 may be formed of a multi-chip package including a plurality of flash memory chips. The memory system 2000 according to at least one example embodiment of the inventive concepts may provide high and/or improved reliability storage media with a low and/or reduced probability of error. In this case, the memory controller 2100 may be configured to communicate with an external device (e.g, a host) via one of various interface protocols, for example, USB, MMC, PCI-E, SAS, SATA, PATA, SCSI, ESDI, IDE and/or the like. The non-volatile memory device 2200 may activate an ODT mode during a period where data may be exchanged essentially based on a command and control signals, for example, according to example embodiments of the inventive concepts described with respect to FIGS. 1-14. It may be possible to provide high and/or increased speed performance via the non-volatile memory device 2200 and to configure a high and/or improved reliability and low and/or reduced power SSD system 2000.

Figure 17:
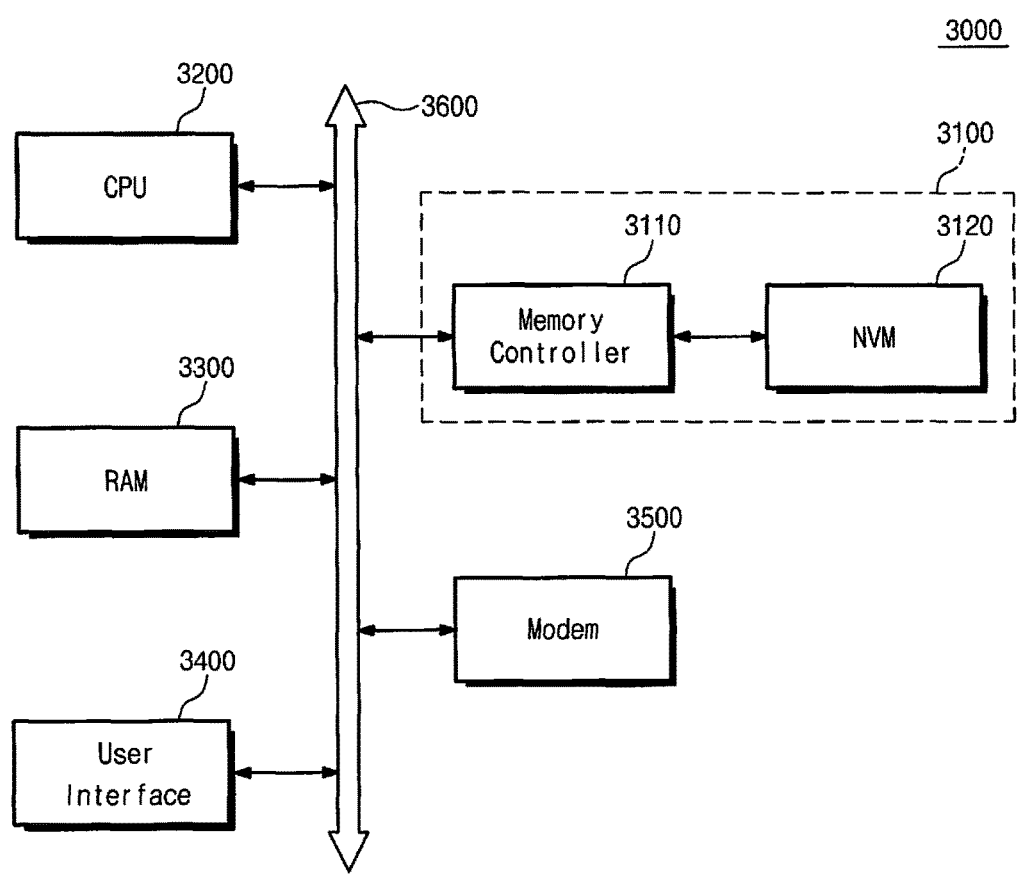

FIG. 17 is a block diagram illustrating computing systems according to example embodiments of the inventive concepts. A computing system 3000 according to at least one example embodiment of the inventive concepts may include a microprocessor 3200, RAM 3300, a user interface 3400, a modem 3500 (e.g., a baseband chipset), and a memory system 3100 electrically connected to a system bus 3600.

The memory system 3100 may include a memory controller 3110 and a non-volatile memory 3120.

In a case where the computing system 3000 may be a mobile device, it may include a battery (not shown) which may supply an operating voltage of the computing system 3000. Although not shown in FIG. 17, the computing system may include an application chipset, a camera image processor (CIS), a mobile DRAM and/or the like. The memory system 3100, for example, may be formed of a solid state drive/disk (SSD) which uses a non-volatile memory storing data. Further, the memory system 3100 may be formed of a fusion flash memory (e.g., a One_NAND flash). The non-volatile memory device 3120 may activate an ODT mode during a period where data may be exchanged essentially based on a command and control signals, for example, according to example embodiments of the inventive concepts described with respect to FIGS. 1-14. It may be possible to provide high and/or increased speed performance via the non-volatile memory device 3120 and to configure a high and/or improved reliability and low and/or reduced power computing system 3000.

A non-volatile memory device and/or a memory controller according to example embodiments of the inventive concepts may be packaged in various packages, for example, PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flatpack), SOIC (Small Outline Integrated Circuit), SSOP (Shrink Small Outline Package), TSOP (Thin Small Outline), TQFP (Thin Quad Flatpack), SIP (System In Package), MCP (Multi Chip Package), WFP (Wafer-level Fabricated Package), WSP (Wafer-Level Processed Stack Package) and/or the like.

While example embodiments have been particularly shown and described, it will be understood by one of ordinary skill in the art that variations in form and detail may be made therein without departing from the spirit and scope of the claims.

What is claimed is:

1. A method of operating a nonvolatile memory device, comprising:
   receiving a write command via data input/output terminals in synchronization with a write enable signal while a command latch enable signal (CLE) is enabled;
   receiving an address via the data input/output terminals in synchronization with the write enable signal while an address latch enable signal (ALE) is enabled, wherein after the receiving the write command and the address, the CLE and the ALE are disabled;
   after the CLE and the ALE are disabled, activating an on-die termination mode of the data input/output terminals in response to an initial falling edge of a data strobe signal and before a rising edge of the data strobe signal, the rising edge of the data strobe signal following the initial falling edge of the data strobe signal;
   receiving write data in synchronization with the data strobe signal; and
   deactivating the on-die termination mode of the data input/output terminals in response to a transition of at least one of a chip enable signal, the ALE, and the CLE;
   wherein the activating the on-die termination mode of the data input/output terminals includes activating a pseudo differential signaling mode of the data input/output terminals and activating a differential signaling mode of the data strobe signal.

2. The method of claim 1, wherein before the receiving the write command or the address, the chip enable signal is enabled.

3. The method of claim 1, wherein the activating the on-die termination mode of the data input/output terminals includes adjusting impedance of the data input/output terminals.

4. The method of claim 1, further comprising:
   detecting a command attribute of the write command; and
   activating an on-die termination mode of the data strobe signal in response to the detected command attribute.

5. A method of operating a nonvolatile memory device, comprising:
   receiving a read command via data input/output terminals in synchronization with a write enable signal while a command latch enable signal (CLE) is enabled;
   receiving an address via the data input/output terminals in synchronization with the write enable signal while an address latch enable signal (ALE) is enabled, wherein, after the receiving the read command and the address, the CLE and the ALE are disabled;
   after the CLE and the ALE are disabled, activating an on-die termination mode of the data input/output terminals in response to an initial falling edge of a read enable signal;
   generating a data strobe signal in response to the read enable signal, wherein the activating the on-die termination mode of the data input/output terminal is before a rising edge of the data strobe signal, the rising edge of the data strobe signal following the initial falling edge of the read enable signal;
   outputting data in synchronization with the data strobe signal; and
   deactivating the on-die termination mode of the data input/output terminal in response to a transition of at least one of a chip enable signal, the ALE, and CLE;
   wherein the activating the on-die termination mode of the data input/output terminals includes adjusting impedance of the data input/output terminals or control signal terminals, activating a pseudo differential signaling mode of the data input/output terminals and activating a differential signaling mode of the read enable signal.

6. The method of claim 5, wherein before the receiving the read command or the address, the chip enable signal is enabled.

7. The method of claim 6, further comprising:
   detecting a command attribute of the read command; and
   activating an on-die termination mode of the read enable signal or the data strobe signal in response to the detected command attribute.

8. A method of operating a nonvolatile memory system including a nonvolatile memory device and a controller, comprising:
   providing, by the controller, a write command via data input/output terminals in synchronization with a write enable signal to the nonvolatile memory device during an enable period of a command latch enable signal (CLE);
   providing, by the controller, an address via the data input/output terminals in synchronization with the write enable signal to the nonvolatile memory device during an enable period of an address latch enable signal (ALE);
   after the providing the write command and the address, disabling the CLE and the ALE by the controller;
   after the CLE and the ALE are disabled, by the nonvolatile memory device, activating an on-die termination mode of the data input/output terminals in response to an initial falling edge of a data strobe signal and before a rising edge of the data strobe signal provided by the controller, the rising edge of the data strobe signal following the initial falling edge of the data strobe signal;

providing, by the controller, write data in synchronization with the data strobe signal to the nonvolatile memory device; and deactivating, by the nonvolatile memory device, the on-die termination mode of the data input/output terminals in response to a transition of at least one of a chip enable signal, the ALE, and the CLE;

wherein the activating the on-die termination mode of the data input/output terminals includes activating a pseudo differential signaling mode of the data input/output terminals and activating a differential signaling mode of the data strobe signal.

9. The method of claim 8, further comprising:
before the providing the write command and the address, enabling the chip enable signal by the controller.

10. The method of claim 8, wherein the activating the on-die termination mode of the data input/output terminals includes adjusting impedance of the data input/output terminals by the nonvolatile memory device.

11. The method of claim 8, further comprising:
detecting a command attribute of the write command by the nonvolatile memory device; and
activating an on-die termination mode of the data strobe signal in response to the detected command attribute.

12. The method of claim 1, wherein the rising edge of the data strobe signal immediately follows the initial falling edge of the data strobe signal.

13. The method of claim 5, wherein the rising edge of the data strobe signal immediately follows the initial falling edge of the read enable signal.

* * * * *